United States Patent
Sung et al.

[11] Patent Number: 5,814,862
[45] Date of Patent: *Sep. 29, 1998

[54] METALLIC SOURCE LINE AND DRAIN PLUG WITH SELF-ALIGNED CONTACTS FOR FLASH MEMORY DEVICE

[75] Inventors: Hung-Cheng Sung, Kaohsinng, Taiwan; Ling Chen, Sunnyvale, Calif.

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 801,659

[22] Filed: Feb. 18, 1997

Related U.S. Application Data

[62] Division of Ser. No. 511,062, Aug. 3, 1995, Pat. No. 5,631,179.

[51] Int. Cl.[6] ............. H01L 29/76; H01L 29/94; H01L 31/062; H01L 31/113
[52] U.S. Cl. ............. 257/344; 257/382; 257/408
[58] Field of Search ............. 257/67, 319, 321, 257/336, 344, 408, 382

[56] References Cited

U.S. PATENT DOCUMENTS

| | | | |
|---|---|---|---|
| 5,204,286 | 4/1993 | Doan | 437/195 |
| 5,231,051 | 7/1993 | Baldi et al. | 437/187 |
| 5,270,240 | 12/1993 | Lee | 257/321 |
| 5,282,160 | 1/1994 | Yamagata | 257/318 |
| 5,312,781 | 5/1994 | Gregor et al. | 437/235 |
| 5,401,992 | 3/1995 | Ono | 257/382 |
| 5,416,349 | 5/1995 | Bergemont | 257/382 |
| 5,500,816 | 3/1996 | Kobayashi | 257/321 |
| 5,517,044 | 5/1996 | Koyama | 257/316 |

*Primary Examiner*—Stephen Meier
*Attorney, Agent, or Firm*—George O. Saile; Stephen B. Ackerman; Graham S. Jones, II

[57] ABSTRACT

Manufacture of an integrated circuit flash memory devices includes covering a semiconductor substrate with a tunnel oxide layer, a floating gate layer, an intergate dielectric layer, a control gate layer, a silicon dioxide dielectric layer over a silicon nitride layer. Then those layers over the tunnel oxide are patterned into flash memory gate electrode by etching through a source/drain mask followed by ion implanting source/drain dopant ions through the openings formed by etching. Sidewall spacers are formed followed by a dielectric layer through which source line openings are etched down to the source/drain regions. Plug openings are made down to the source/drain regions. An intermetal dielectric layer is deposited comprising PEOX/SOG/PEOX over the device. Then via openings are made over the drain plugs by etching the intermetal dielectric layer through a via mask. Next metal is deposited over the intermetal dielectric layer into the via openings extending down into contact with the drain plugs.

18 Claims, 9 Drawing Sheets

METALLIC SOURCE LINE AND DRAIN PLUG WITH SELF-ALIGNED CONTACTS FOR FLASH MEMORY DEVICE

This is a divisional application based on U.S. patent application Ser. No. 08.511.062, filed Aug. 3, 1995, now U.S. Pat. No. 5,631,179.

BACKGROUND OF THE INVENTION

1. Field of the Invention

This invention relates to semiconductor memory devices and more particularly electrical connections to bit lines in memory devices

2. Description of Related Art

U.S. Pat. No. 5,204,286 of Doan for "Method of Making Self-Aligned Contacts and Vertical Interconnects to Integrated Circuits" and U.S. Pat. No. 5,231,051 of Baldi et al for "Method for Formation of Contact Plugs Utilizing Etchback" show use of deposits of tungsten which are etched back to form contacts.

In a conventional EPROM (Flash memory) layout, the source line is a diffusion type which must connect to a metal pick-up for about 16 cells. In addition, the drain contact to the poly is not self-aligned. Both of these factors limit the ability to reduce the scale (dimensions) of EPROM (Flash) memory devices.

SUMMARY OF THE INVENTION

By using a design in accordance with this invention, the number of source pickups can be reduced to a very substantial degree.

In addition, the polysilicon to contact space can be zero. The area saved can be about 20%, and the source resistance decreases. As a result the performance of memory devices is improved substantially.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

By using a design in accordance with this invention, the number of source pickups can be reduced to a very substantial degree. Another advantage is that the polysilicon to contact space can be zero. The area saved can be about 20%. Moreover, the source resistance decreases. Thus, the performance of memory devices can be considerably enhanced.

Figure 1A:
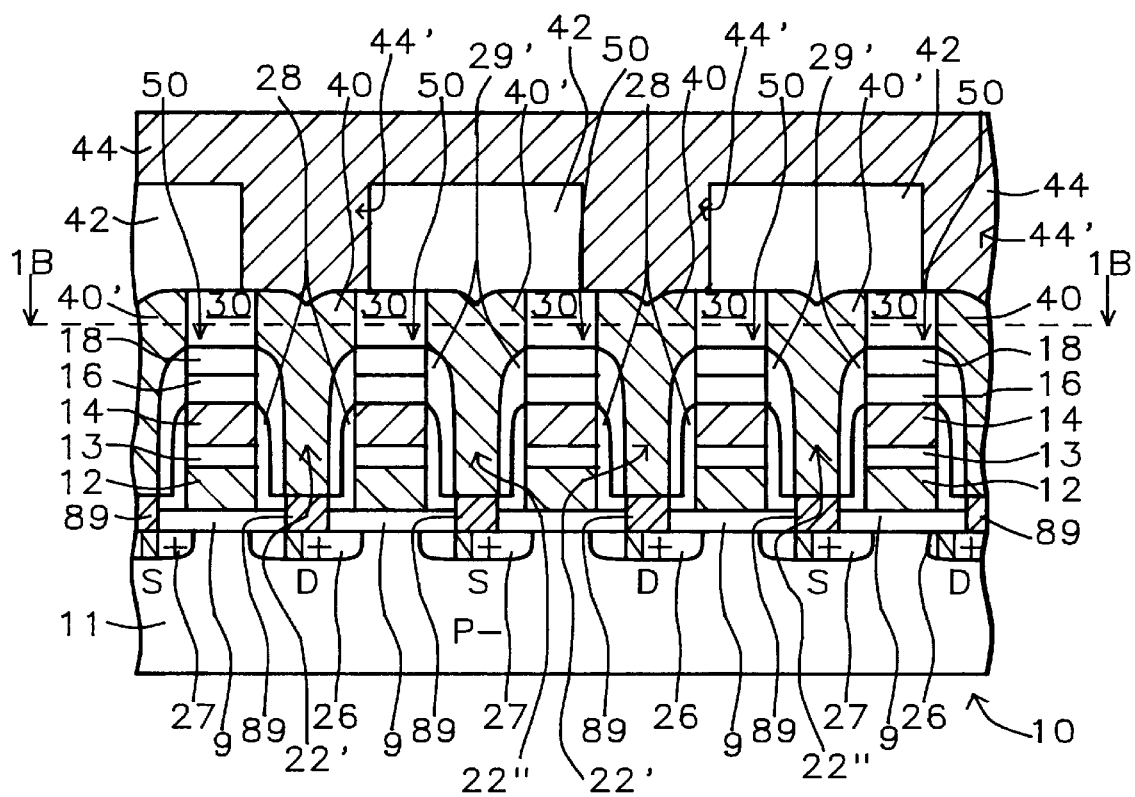
FIG. 1A shows a flash memory device sectional view of a flash memory device 10 taken along line 1A—1A in FIG. 1B. The flash memory device shown in FIG. 1A incorporates the features of this invention and is made in accordance with the method of this invention.
Figure 1B:
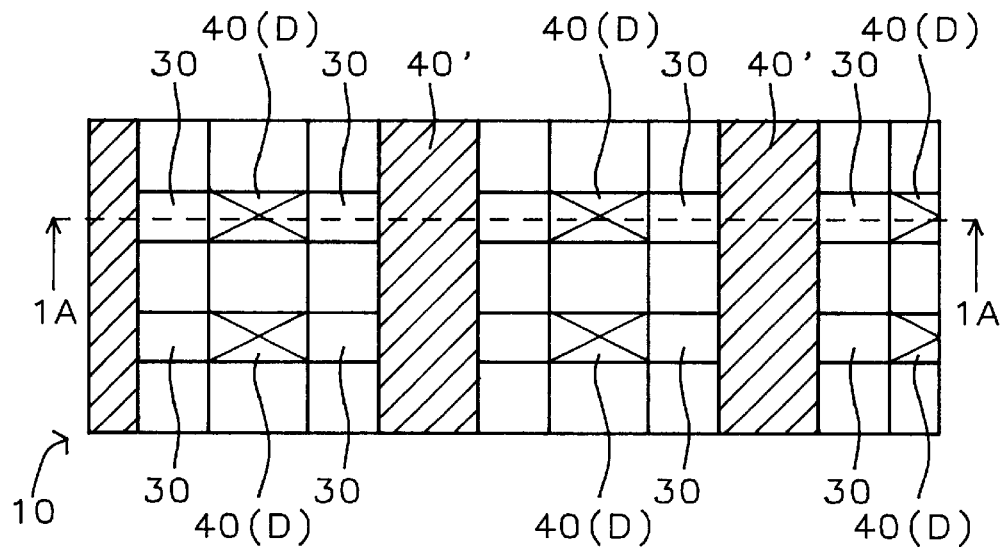
FIG. 1B is a sectional view of the device of FIG. 1A taken along line 1B—1B in FIG. 1A.

FIG. 1A shows a sectional view of a flash memory device 10 taken along line 1A—1A in FIG. 1B. FIG. 1B is a sectional view of the device of FIG. 1A taken along line 1B—1B in FIG. 1A. The flash memory device device 10 is formed on a P- lightly doped silicon semiconductor substrate 11 upon which a tunnel oxide layer 9 comprising an oxide of silicon has been formed having a thickness of between about 80 Å and 120 Å. Over tunnel oxide layer 9 are formed stacks 50 of floating gate electrodes 12, an ONO intergate dielectric layer 13, control gate electrodes 14, and two additional dielectric layers including TEOS glass layer 16 and silicon nitride ($Si_3N_4$) dielectric layer 18. The stacks 50 have sidewalls on the edges of floating gate electrodes 12, ONO layer 13, control gate electrodes 14, TEOS glass layer 16 and silicon nitride ($Si_3N_4$) layer 18.

The floating gate electrodes 12 are composed of doped polysilicon, formed from a control gates layer 12. Preferably, the floating gate electrode has a thickness between about 1,300 Å and about 1,500 Å. Above floating gate electrodes 12, a conventional ONO intergate dielectric layer 13 has been deposited with a thickness between about 250 Å and about 300 Å. Formed above ONO dielectric layer 13, are control gate electrodes 14 composed of a second doped polysilicon layer. Control gate electrodes 14 preferably have a thickness between about 3,000 Å and about 4,000 Å.

Above the control gate electrodes 14 is formed a silicon dioxide TEOS (tetraethylorthosilicate) dielectric layer 16, with a thickness between about 1,500 Å and about 2,000 Å. In turn, above dielectric layer 16, a silicon nitride ($Si_3N_4$) dielectric layer 18 is formed with a thickness between about 500 Å and about 800 Å. Layer 18 completes stacks 50 of gate electrodes 12 and 14, ONO layer 13, dielectric layer 16 topped off by the dielectric layer 18. Stacks 50 are separated by trench spaces 22' and 22' which are of substantially equal widths.

Between the stacks 50, in the silicon semiconductor substrate 11 are formed doped drain regions 26 located below trench spaces 22' and source regions 27 located below trench spaces 22". Drain regions 26 and source regions 27 are MDD (Medium Doped Drain) ion implanted regions with a concentration of implanted atoms between about $1 \times 10^{15}$ atoms/cm$^3$ and about $5 \times 10^{15}$ atoms/cm$^3$ to form MDD junction of source regions 27 and drain regions 26 in substrate 11.

There are oxidized sidewall films 28 in trench spaces 22' and 22" formed on the sidewalls of the stacks 50 covering the edge surfaces of gate electrodes 12 and 14, and ONO layer 13. The oxidized sidewall films 28 are formed with a thickness between about 100 Å and about 200 Å.

On the sidewall films 28 and on the sidewall edges of dielectric layer 16 and dielectric layer 18 are formed silicon nitride ($Si_3N_4$) spacers 29' with a thickness between about 1,500 Å and about 2,000 Å. The N+ implant is done after spacer formation to form source and drain junction.

Above the stacks 50 are formed planarized BPTEOS, interlayer dielectric (ILD), regions 30 with a thickness between about 3,000 Å and about 4,000 Å.

Tungsten plugs 40 and source lines 40' are formed above the drain regions 26 and the source regions 27, between the BPTEOS regions 30 and between the stacks 50 of floating gates 12, ONO layer 13 and control gates 14, completely filling the space between the sidewalls 29' above the drain and source regions 26 and 27.

Tungsten drain plugs 40 and source lines 40' reach down between spacers 29' into contact with the drain regions 26 and source regions 27.

An intermetal dielectric (IMD) layer 42 with a thickness between about 10,000 Å and about 12,000 Å has been formed over the drain plugs 40 and source lines 40' with openings down to the drain plugs 40 over the drain regions 26, but covering the source lines 40' over the source regions 27.

The metal bit-line material 44 with a thickness between about 7,000 Å and about 8,000 Å has been deposited as a blanket layer over intermetal dielectric layer 42, and then etched to provide the metal bit-lines 44 in accordance with the two parallel bit-line patterns seen in FIG. 1B, as well as the vias 44' which extend down into contact only with the drain plugs 40 which connect to the drain regions 26, since the dielectric regions 42 serving as an electrical insulator separates the bit-lines 44 from the source lines 40'.

In FIG. 1B, the location of the contacts with drain regions 26 below is indicated by X markings. The source lines 40' over the source regions extend from front to back. The contact the drains 26 covering the tops of the source regions 27 as the bridge over the top surfaces of plugs 29" as shown in FIG. 1A.

Process

Figure 2A:
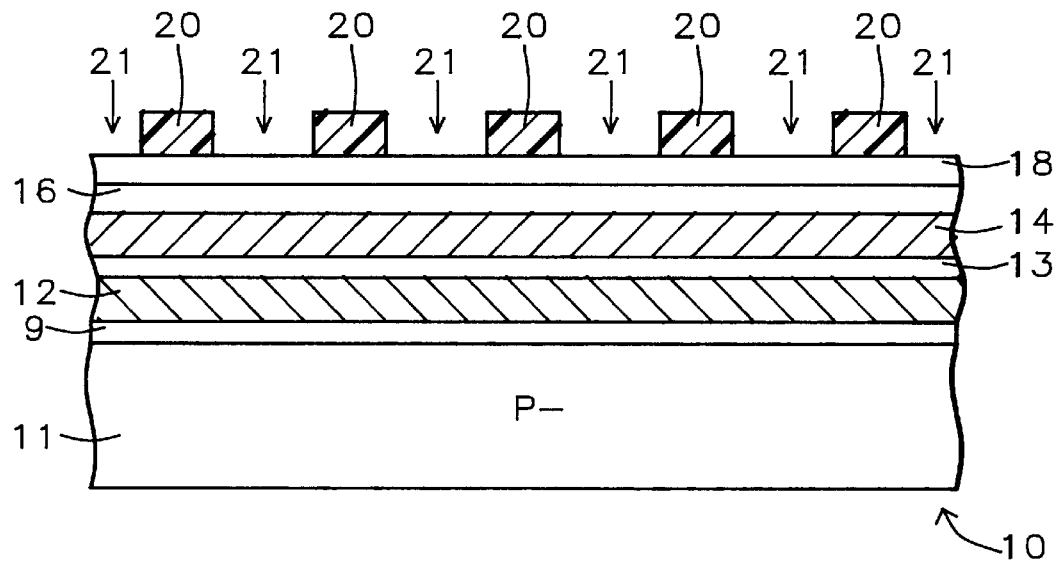
FIGS. 2A–2C shows the flash memory device of FIGS. 1A and 1B in views taken along line 2C—2C in FIG. 2E illustrating the early stages of performance of the method of manufacturing in accordance with this invention.
Figure 2B:
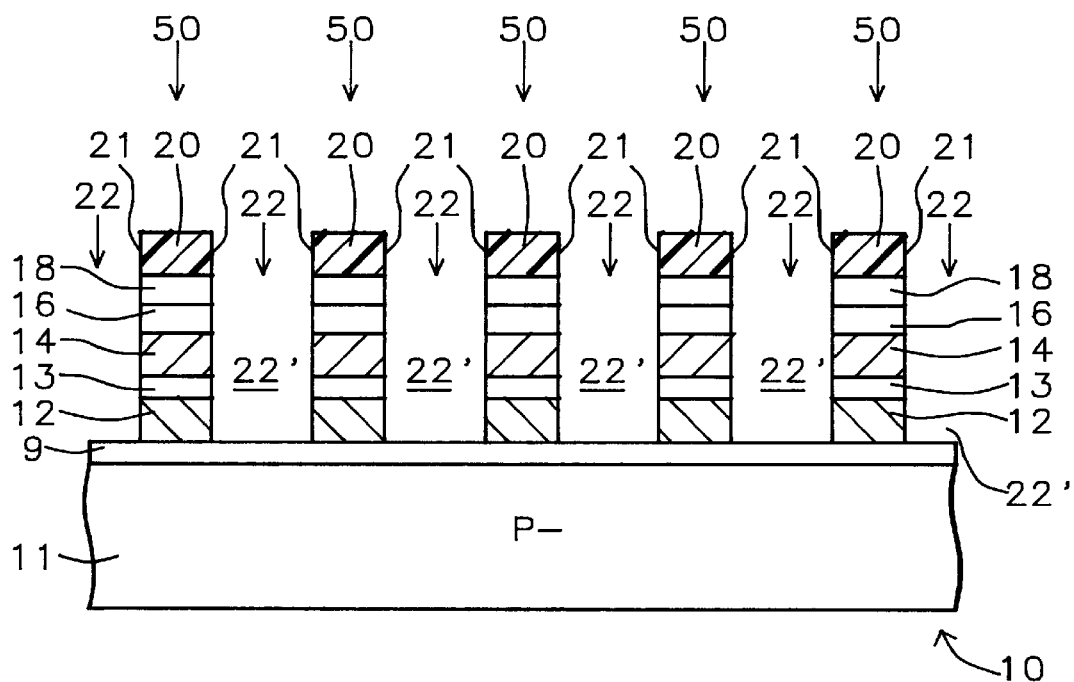
Figure 2C:
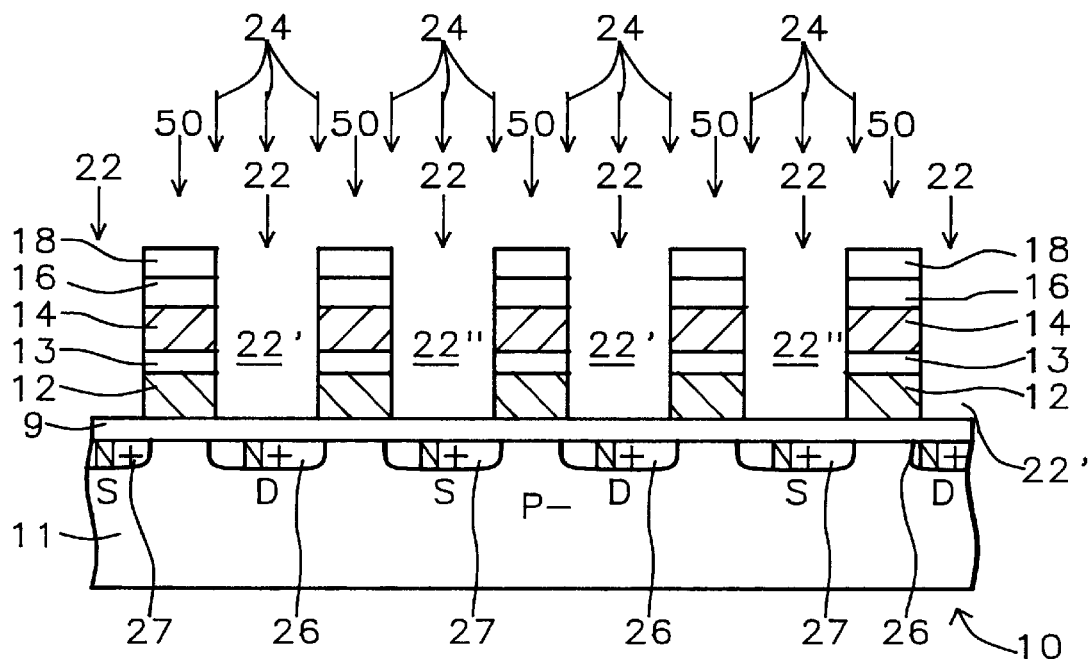

FIGS. 2A–2C are a sectional views showing the early stages of of manufacturing of the completed flash memory device 10 of FIGS. 1A and 1B. FIGS. 2A–2C are a sectional views taken along line 2C—2C in FIG. 2E of flash memory device 10. Referring to FIG. 2A, a partially completed flash memory device 10 is being formed on a P- lightly doped silicon semiconductor substrate 11 upon which a conventional tunnel oxide layer 9 has been formed. Tunnel oxide layer 9 comprises a thin oxide of silicon having a thickness between about 80 Å and about 120 Å.

Then a floating gate layer 12 composed of a blanket deposit of doped polysilicon (P1) layer is formed over tunnel oxide layer 9. Above floating gate layer 12, a conventional ONO (intergate) dielectric layer 13 is deposited. Next, a blanket control gate layer 14, preferably composed of polycide (P2) is formed upon ONO dielectric layer 13.

The floating gate layer 12 comprises a heavily doped layer of polysilicon formed by either thermal reduction of $SiHCl_3$ (or dichlorosilane $SiH_2Cl_2$) in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure.

The control gates layer 14 is formed of a conventional polycide (P2) layer material which preferably comprises tungsten silicide with a thickness between about 1,000 Å and about 2,000 Å, which is formed over a base of polysilicon with a thickness between about 1,000 Å and about 2,000 Å.

Then above control gates layer 14, a silicon dioxide TEOS (tetraethylorthosilicate) dielectric layer 16 has been deposited between about 6500° and 750° C. in an LPCVD reactor by decomposing tetraethoxysilane, $Si(OC_2H_5)_4$ vaporized from a liquid source producing a complex mixture of organic and organosilicon compounds LPCVD with a gas mixture of $SiH_2Cl_2/NH_3$, 0.3 Torr within a temperature range between about 800° C. and about 850° C.

Subsequently, a silicon nitride ($Si_3N_4$) layer 18 is deposited in a blanket layer over the TEOS glass layer 16.

Above the silicon nitride ($Si_3N_4$) layer 18, a source/drain photoresist mask 20 has been formed with equally spaced source/drain openings 21 therein above the regions below where drain regions 26 and source regions 27 are formed in the flash memory device 10, as shown in FIG. 1A.

FIG. 2B shows the device of FIG. 2A after etching of openings 22 forming trench spaces 22' over drain regions 26 and trench spaces 22" over source regions 27 extending down through the layers 18, 16, 14, 13 and 12 to the surface of substrate 11 using mask 20 to control the etching. The result of this etching is the stacks 50 of gate electrodes 12 and 14, ONO layer 13, dielectric layer 16 and dielectric layer 18 separated by trench spaces 22' and 22".

Figure 2D:
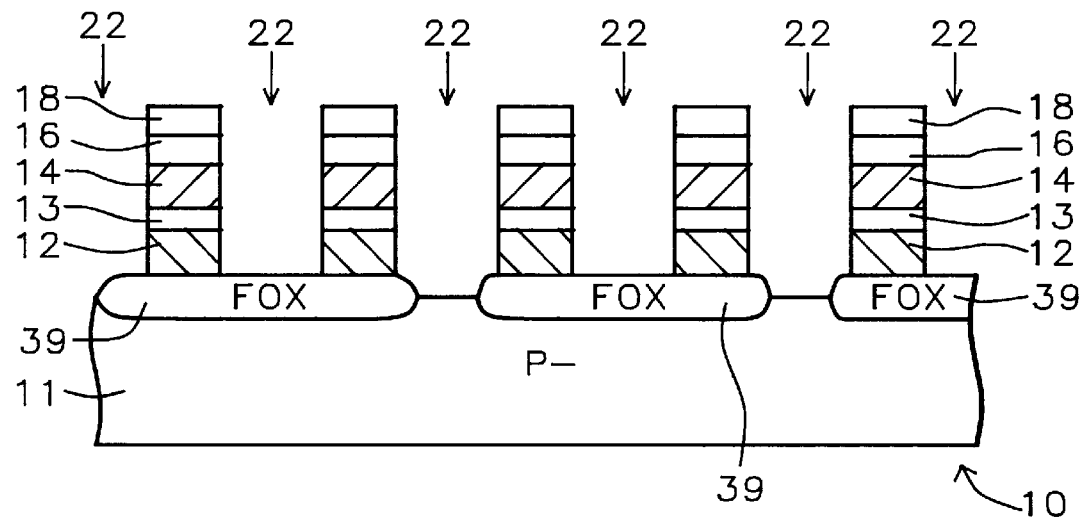
FIG. 2D is a section taken along line 2D—2D in FIG. 2E.
Figure 2E:
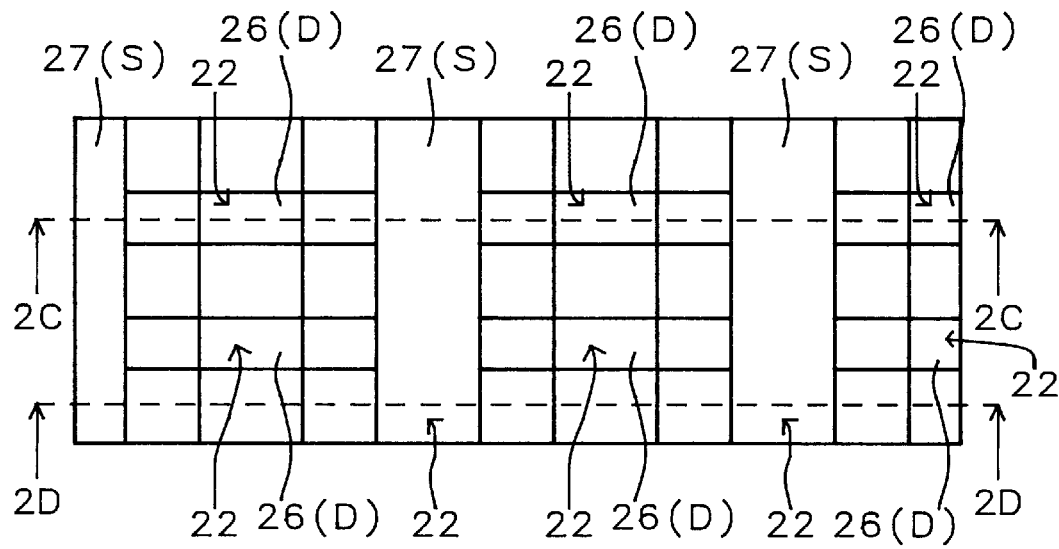
FIG. 2E is a plan view of the device of FIGS. 2C and 2D showing the trench spaces down to the surfaces of drain and source regions in the substrate.

FIG. 2C is a sectional view taken along line 2C—2C in FIG. 2E, which is a plan view showing the trench spaces 22'0 and 22" down to the surfaces of drain regions 26 and source regions 27, in the substrate 11. FIG. 2C shows the device of FIG. 2B after self-aligned ion implantation of arsenic (chemical variety) of dopant ions 24 are deposited through trench spaces 22' and 22" between stacks 50 into the drain regions 26 and source regions 27, respectively, in an MDD (Medium Doped Drain) ion implanting process with a concentration of implanted ions between about $1 \times 10^{20}$ atoms/cm$^3$ and about $1 \times 10^{21}$ atoms/cm$^3$ to form the MDD junction of source regions 27 and drain regions 26 in substrate 11.

The ion implanted dopant 24, which is preferably arsenic (chemical species or variety of impurity) is implanted with a dose of between about $1 \times 10^{15}$ ions/cm$^2$ and about $5 \times 10^{15}$ ions/cm2. It is implanted at an energy of between about 50 keV and about 80 keV in a medium energy implanter tool.

FIG. 2D is a section taken along line 2D—2D in FIG. 2E which shows a set of field oxide (FOX) regions 39 formed over and extending partially down into the substrate 11. the stack of layers floating gates 12, ONO dielectric layer 13 control gates 14, the TEOS glass layer 16 and silicon nitride ($Si_3N_4$) layer 16 with trenches 22 therebetween.

Figure 2F:
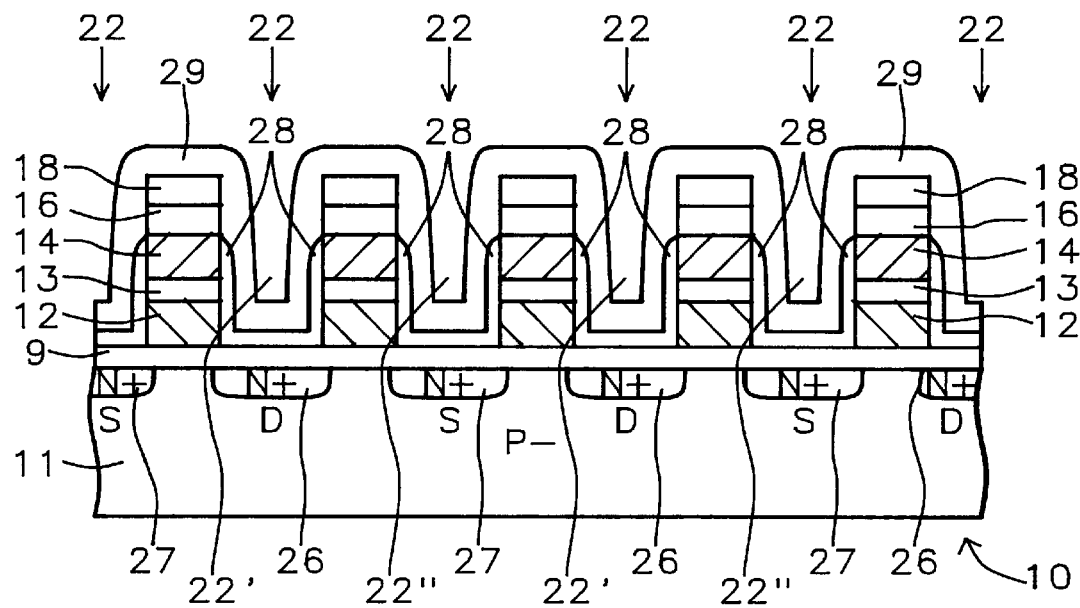
FIG. 2F is a section taken along line 2C—2C in FIG. 2E shows the device of FIG. 2C, after the formation of oxidized sidewalls within trench spaces on the exposed sidewall surfaces of floating gates layer, ONO dielectric layer, and the control gates layer.

FIG. 2F is a section taken along line 2C—2C in FIG. 2E shows the device of FIG. 2C, after the formation of oxidized sidewall films 28, within trench spaces 22' and 22" on the exposed sidewall surfaces of floating gates layer 12, ONO dielectric layer 13, and control gates layer 14. Then the oxidized sidewall films 28 are formed on the exposed edges of the gate electrodes formed from control gates layer 12, ONO dielectric layer 13, and second polysilicon layer 14. The oxidized sidewall films 28 have a thickness between about 100 Å and about 200 Å.

Later, there is formed a blanket silicon nitride ($Si_3N_4$) layer 29 over the entire flash memory device 10 including the space within trench spaces 22' and the exposed surfaces of the source regions 27 and drain regions 26 of substrate 11 and upon oxidized sidewall films 28. Next, the blanket silicon nitride ($Si_3N_4$) layer 29 is subjected to an etching process to etch back layer 29 to form silicon nitride spacers 29' (as seen in FIG. 1A and FIG. 2G) adjacent to the sidewalls of stacks 50.

Before the etch back, the blanket layer 29 originally has a thickness between about 1,500 Å and about 2,000 Å. After the etch back process, silicon nitride ($Si_3N_4$) spacers 29' have a thickness between about 1,500 Å and about 2,000 Å.

The layer 29 is etched back to form the spacers 29' by plasma etching with $SF_6$ gas at a pressure of about 400 mTorr. After the spacer etching step, there is an N+ implant of arsenic implanted at an energy of between about 40 keV and about 60 keV with a dose of between about $3 \times 10^{15}$ ions/cm$^2$ and about $5 \times 10^{15}$ ions/cm2.

Figure 2G:
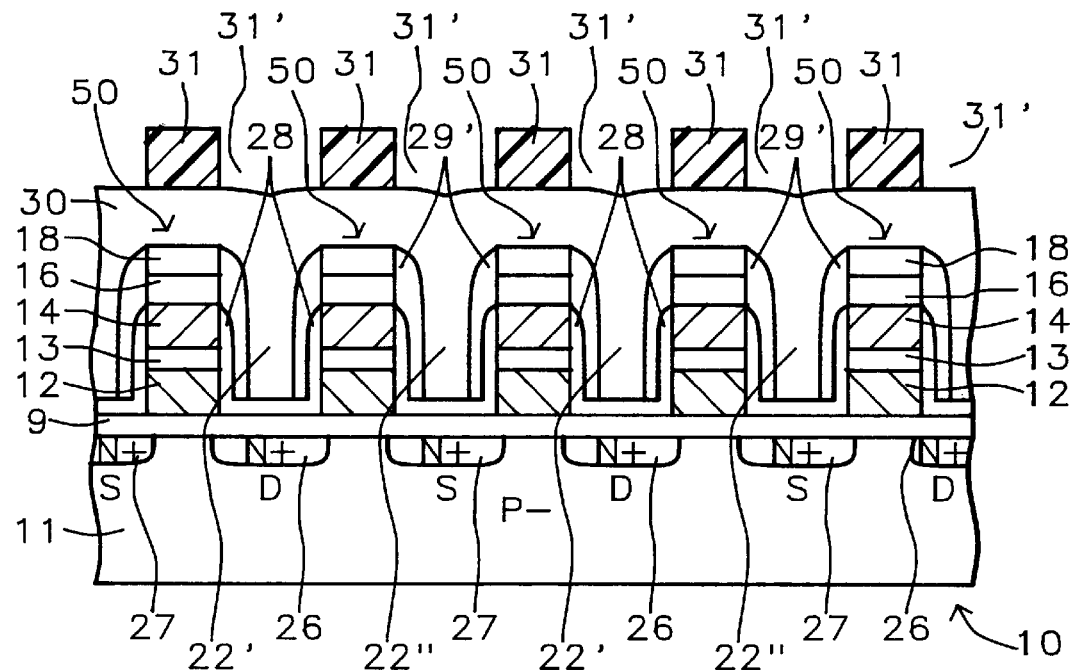
FIG. 2G is a section taken along line 2G—2G in FIG. 2H showing the device of FIG. 2F after the blanket deposition over the partially completed flash memory device of a BPTEOS dielectric layer.
Figure 2H:
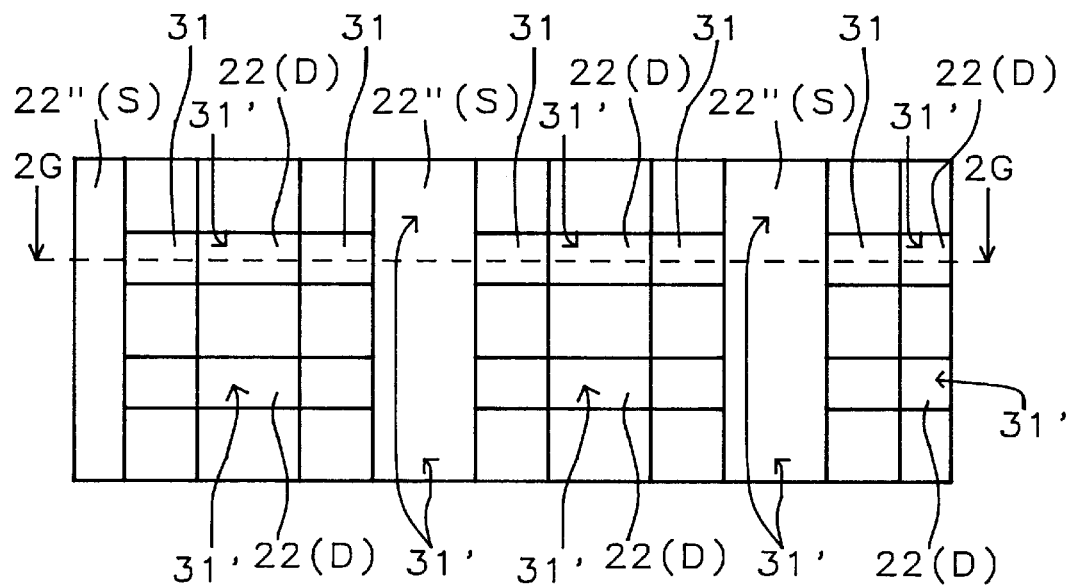
FIG. 2H is a plan view of the device of FIG. 2G showing the pattern of a mask seen in FIG. 2G.

FIG. 2G is a section taken along line 2G—2G in FIG. 2H, which shows the device 10 of FIG. 2F after the blanket deposition over the partially completed flash memory device 10 of a BPTEOS, dielectric layer 30 with a thickness between about 8,000 Å and about 11,000 Å.

The BPTEOS layer 30 is formed by depositing a glass dielectric layer of BPTEOS (composed of Boron, Phosphorus, Tetraethylorthosilicate) with a concentration of boron (B) between about 2.5 wt. % to about 5 wt. % and with a concentration of phosphorous (P) between about 3 wt. % to about 5.5 wt. %. The BPTEOS layer is formed with a CVD tool selected from APCVD, PECVD, LPCVD (Low Pressure C.V.D.) which deposits BPTEOS. The typical BPTEOS composition comprise a boron-phosphorous SiO2 with boron of 4 wt. % and phosphorous of 4 wt. %.

Next, an etching process is performed to planarize the BPTEOS layer 30.

Following the planarization of the BPTEOS layer 30, a photoresist mask 31 shown in FIG. 2G (see FIG. 3A also) is formed over the partially completed flash memory device 10. Mask 31 is used in the process of making electrical contacts to drain regions 26 and simultaneously making electrical contacts to source regions 27. Openings 31' through mask 31 are formed therein over trench spaces 22' between the stacks 50.

Figure 3A:
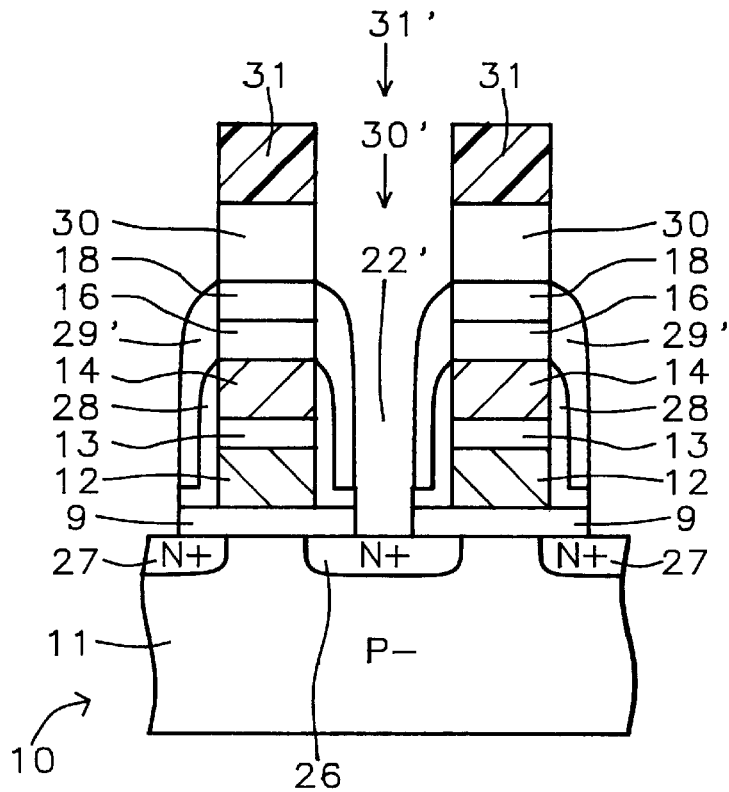
FIGS. 3A and 3B show a fragment of the partially completed flash memory device of FIGS. 2G and 2H.

FIG. 3A shows a fragment of the partially completed flash memory device 10 of FIGS. 2G and 2H after the BPTEOS layer 30 has had openings 30' etched therethrough where there are openings in the photoresist mask 31 (which is seen in FIG. 2G.) FIG. 2H shows a plan view of the device 10 of FIG. 2G with mask 31 and its openings 31'. The portions of the BPTEOS layer 30 not protected by that mask 31 have been etched down to the surface of the drain regions 26 and down to the surface of the source regions 27 through both the BPTEOS layer 30 and the exposed portions of the tunnel oxide layer 9 therebelow. The pattern of the mask 31 is seen in FIG. 2H, which is a plan view of the device 10 of FIG. 2G.

The process used to etch BPTEOS layer 30 comprises selective etching in a plasma etching machine with a gas mixture of $C_4F_8/CF_8/CO/Ar$. This machine and the recipe employed allows high selectivity of BPTEOS/$Si_3N_4$ of with a ratio of from about 18/1 to about 30/1 so that $Si_3N_4$ spacers 29' are not significantly etched. The preferred ratio is about 28/1. The preferred conditions for the process are a pressure of 100 mTorr, a power of 1,000 watts, and the gas mixture of $C_4F_8/CF_8/CO/Ar$ in a ratio of 5/10/200/600 sccm.

Figure 2I:
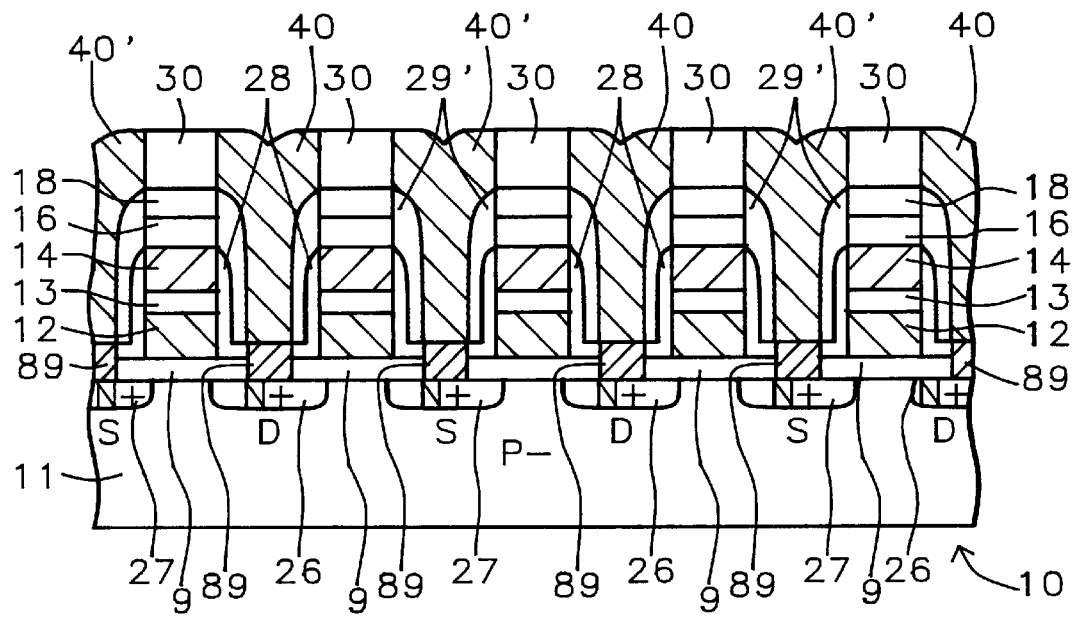
FIG. 2I shows the partially completed flash memory device of FIGS. 2G and 2H after the BPTEOS layer has been etched through a photoresist mask.
Figure 3B:
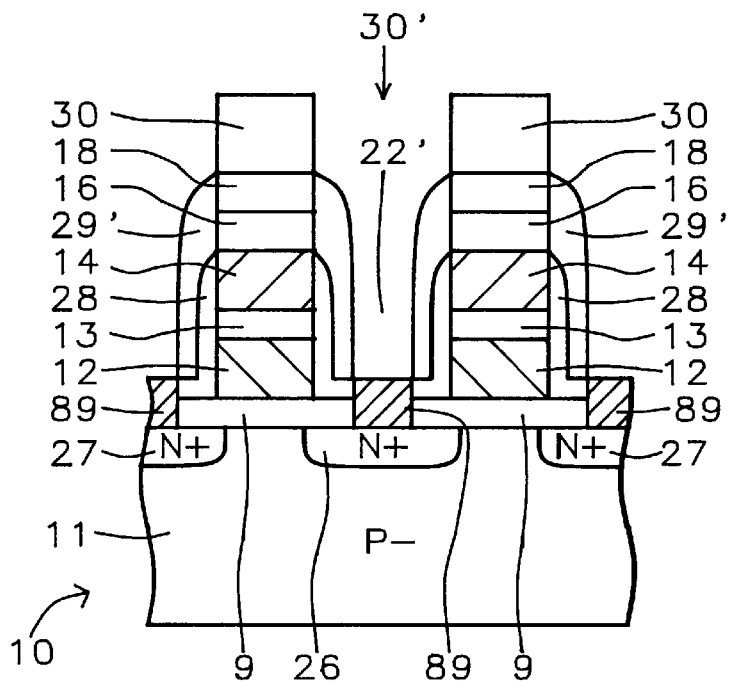

FIG. 3B shows a fragment of a partially completed flash memory device 10 of FIGS. 2G and 2H after a barrier metal layer of Ti/TiN=400 Å to 1,000 Å is deposited by sputtering on the device 10 through the openings in the layer 30 over the drain regions 26 and the source regions 27. As a result barrier metal layers 89 are formed on the exposed surfaces of the drain regions 26 and the source regions 27 in the spaces 22' seen in FIGS. 3B and 2I.

A blanket layer of tungsten metal 40 having a thickness between about 6,000 Å and about 8,000 Å is deposited upon the device 10 after etching of the BPTEOS layer 30, the removal of photoresist mask 31, and formation of the barrier metal layers 89 on the drain regions 26 and the source regions 27. The tungsten metal 40 reaches down into the openings in the BPTEOS layer 30 to contact the barrier metal layers 89 and over the spacers 29' thereby forming electrical contact from the tungsten metal 40 through the drain regions 26 and the source regions 27.

The process of deposition of tungsten metal 40 includes a nucleation step followed by a main step. Nucleation step parameters are: 4.5 Torr, 475° C., Ar/$N_2$/$SiH_4$/$WF_6$. Main step parameters are: 80 Torr, 475° C., Ar/$N_2$/$H_2$/$WF_6$.

Periphery Metal and Define/Etch

After the tungsten metal (W) etch back, AlSiCu (4,000 Å) is deposited and defined to form the first metal layer (M-1) interconnection in the peripheral circuit. In the cell region, the first metal layer (M-1) is fully etched.

By means of an etch back process, tungsten metal drain plugs 40 and source lines 40' are formed above the drain regions 26 and the source regions 27, between the BPTEOS ILD regions 30 and between the stacks 50 of floating gates 12, ONO layer 13 and control gates 14, completely filling the space between the sidewalls 29' above the drain and source regions 26 and 27.

Tungsten drain plugs 40 over the drain regions 26 and source lines 40' over the source regions 27 reach down between spacers 29' into contact with the drain regions 26 and source regions 27, respectively.

Figure 2J:
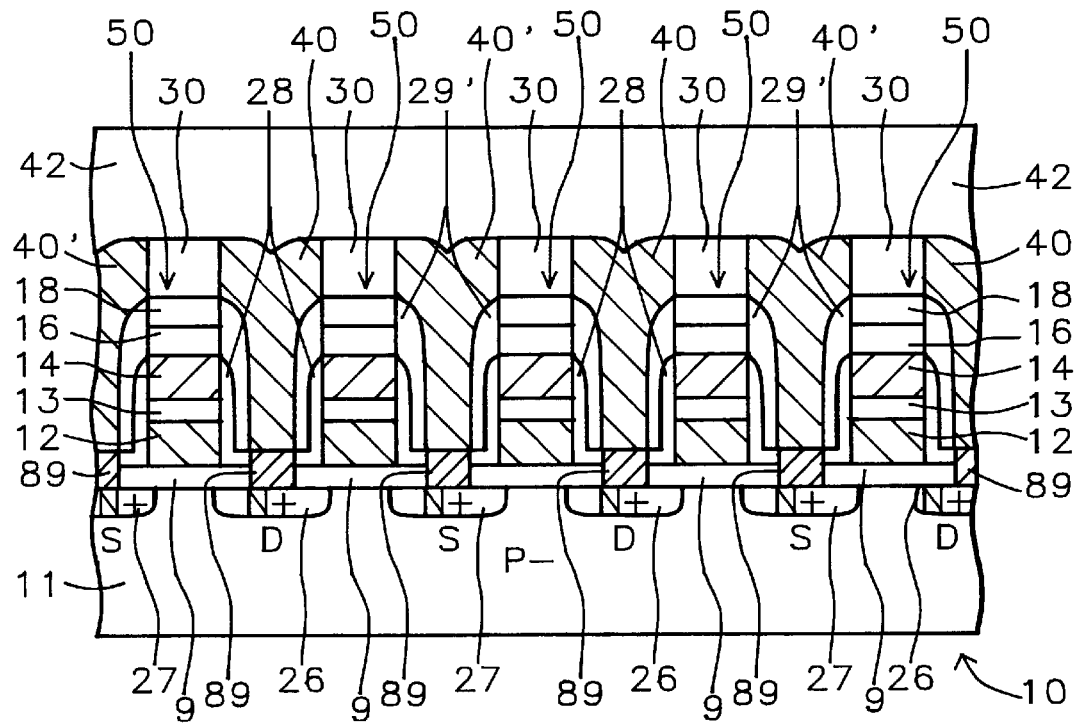
FIG. 2J shows the device of FIG. 2I after the blanket deposition of an IMD (Inter Metal Dielectric) layer.

FIG. 2J shows the device 10 of FIG. 2I after the blanket deposition of an intermetal dielectric (IMD) layer 42 has been formed over the drain plugs 40 and source lines 40' and over BPTEOS ILD (Inter Layer Dielectric) layer 42 is formed by PEOX/SOG/PEOX deposition, where PEOX= Plasma Enhanced OXide, and SOG=Spin On Glass.

The PEOX/SOG/PEOX dielectric is preferably formed by the process recipe of PEOX:gas: $SiH_4$/$N_2O$ at a Temp>300° C. and a pressure of 1 Torr. The PEOX (1) thickness is between about 2,000 Å and about 3,000 Å. The SOG thickness is between about 3,000 Å and about 4,000 Å. The PEOX (2) thickness is between about 5,000 Å and about 6,000 Å.

Figure 2K:
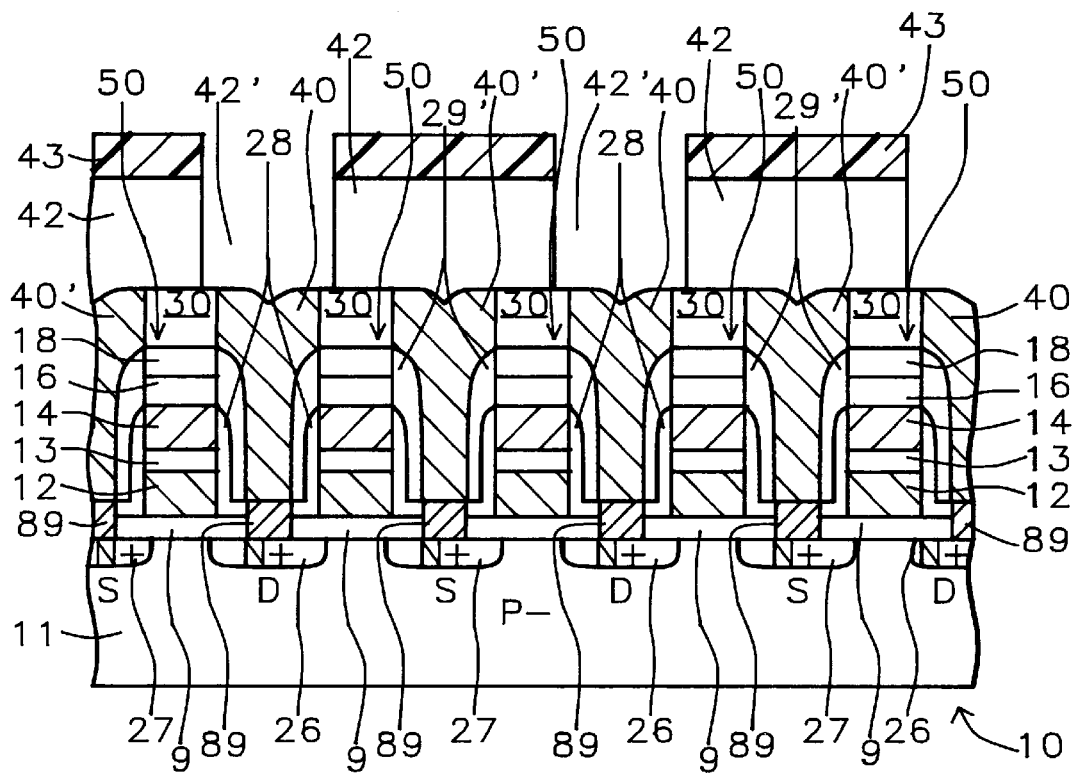
FIG. 2K shows the device of FIG. 2J after formation of a via mask with via openings therethrough has been formed over the IMD layer, and has been used to etch, through holes therein, via openings down through the IMD layer to the surface of drain plugs over drain regions, but not over source lines which overlie source regions.

FIG. 2K shows the device 10 of FIG. 2J after formation of a via mask 43 with via openings 43' therethrough formed over IMD layer 42, and has been used to etch, through holes 43' therein, via openings 42' down through IMD layer 42 to the surface of drain plugs 40 over drain regions 26, but not over source lines 40' which overlie source regions 27.

Figure 2L:
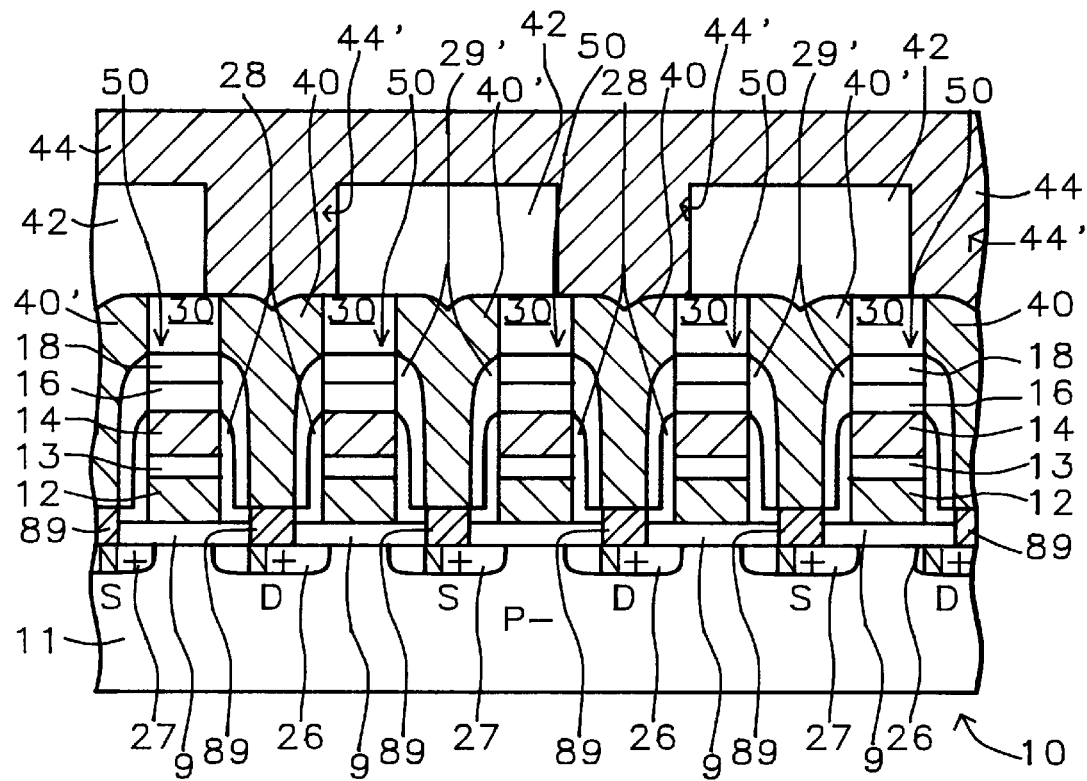
FIG. 2L is a sectional elevation view taken along line 2L—2L in FIG. 2M.
Figure 2M:
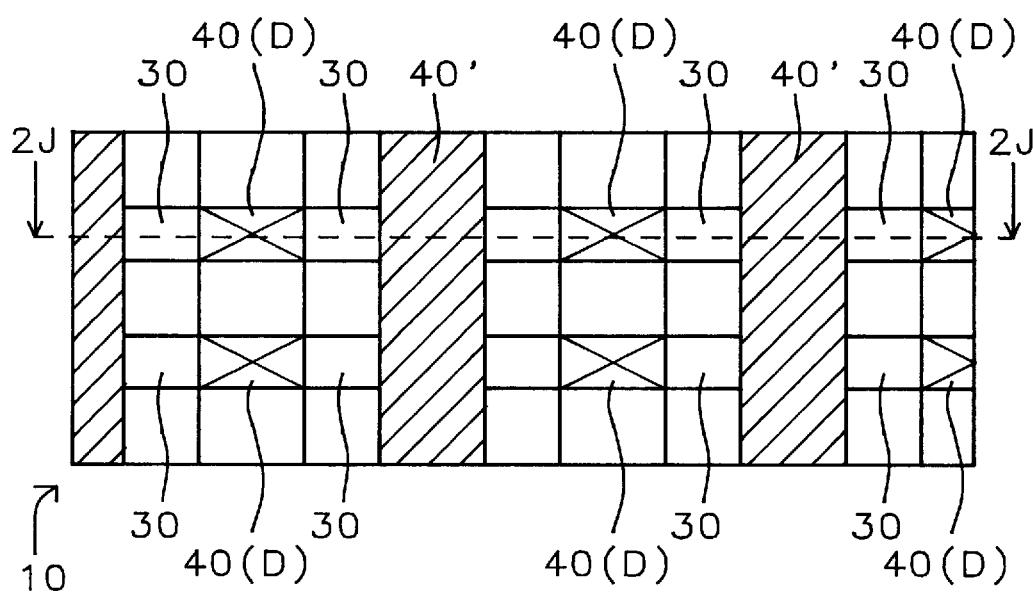
FIG. 2M is a sectional plan view taken along line 2M—2M in FIG. 2L.

FIG. 2L is a sectional elevation view of device 10 taken along line 2L—2L in FIG. 2M. FIG. 2L shows the flash memory device 10 of FIGS. 2K after the bit-line metal 44 has been formed over the device of FIG. 2K including the IMD layer 42 extending down into contact with drain plugs 40 through openings 42' in IMD layer 42 shown in FIG. 2K.

The bit-line 44 has been patterned by formation of a photoresist mask (not shown) formed over the metal bit-line material 44. Bit-line layer 44 is then etched to provide the metal bit-lines 44 in accordance with the two parallel bit-line patterns seen in FIG. 1B. Then the metal bit-line material is etched providing metal bit-lines 44. Metal bit-lines 44 are Ti/AlSiCu/TiN, about 8,000 Å thick.

FIG. 2M is a sectional plan view of the device 10 taken along line 2M—2M in FIG. 2L.

In FIG. 2M, the location of metal drain plugs 40 and the contacts with drain regions 26 below is indicated by X markings. The BPSG regions 30 are marked as the white areas. The metal bit-lines 44 which contact the drain plugs 40 bridge over the top surfaces of dielectric layer 42 as shown in FIG. 2L.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An integrated circuit with memory devices comprising:

a semiconductor substrate having said memory devices therein to which electrical connections are made, a tunnel oxide layer on said substrate, an array of gate electrode stacks formed on said tunnel oxide layer, said stacks having sidewalls with trench spaces therebetween down to said tunnel oxide layer, and said sidewalls having oxidized sidewall films formed thereon, said gate electrode stacks including a doped floating gate electrode over said tunnel oxide layer, an intergate dielectric layer over said floating gate electrode, a doped control gate electrode over said intergate dielectric layer, a silicon dioxide first dielectric layer over said control gate electrode, and a silicon nitride ($Si_3N_4$) layer over said silicon dioxide layer, ion implanted source/drain regions formed between said stacks with alternating source regions and drain regions below said trench spaces between said sidewall, said source/drain regions being aligned with said stacks, spacers comprising dielectric structures composed of thin oxidized sidewall films contacting said sidewalls having a thickness from about 100 Å to about 200 Å covered with silicon nitride having a thickness from about 1500 Å to about 2000 Å contacting said thin sidewall oxide films and said first dielectric layer, a second dielectric layer over said stacks, said trench spaces and said sidewalls, said second dielectric layer having source line openings therein down to said source regions through said second dielectric layer, said sidewall, said spacers, and said tunnel oxide, and said second dielectric layer having drain plug openings down to said drain regions between said spacers through said second dielectric layer and said tunnel oxide, down to said source regions and said drain regions, source conductive metal lines (40) filling said source line openings and contacting said source regions through said source line openings, said source conductive lines being located between said stacks and said spacers over said source regions, drain conductive metal lines filling said drain plug openings with drain plugs (40') in contact with said drain regions through said drain plug openings, said drain plugs, (40') being located over said drain regions and between said stacks and said spacers, an intermetal dielectric layer (42) over said source lines, via openings over said drain plugs through said intermetal dielectric layer, and bit line metal (44) formed over said intermetal dielectric layer into said via openings extending down into contact with said drain plugs, whereby said memory devices include metallic source lines and drain plugs.

2. A device in accordance with claim 1 wherein:

said intermetal dielectric layer comprises a PEOX/SOG/PEOX dielectric layer formed with a first PEOX layer with a thickness between about 2,000 Å and about 3,000 Å, a SOG layer with a thickness between about 3,000 Å and about 4,000 Å, and a second PEOX layer with a thickness between about 5,000 Å and about 6,000 Å.

3. A device in accordance with claim 2 wherein:

said second dielectric layer comprises BPTEOS boron-phosphorous $SiO_2$, and said source regions and said drain regions comprise MDD (Medium Doped Drain) ion implanted doped regions.

4. A device in accordance with claim 3 wherein:

said source regions and said drain regions comprise MDD (Medium Doped Drain) ion implanted doped regions.

5. The device of claim 3 wherein:

said conductive metal lines comprise tungsten metal.

6. A device in accordance with claim 2 wherein:

said source regions and said drain regions comprise MDD (Medium Doped Drain) ion implanted doped regions.

7. The device of claim 2 wherein:

said conductive metal lines comprise tungsten metal.

8. A device in accordance with claim 1 wherein:

said second dielectric layer comprises BPTEOS boron-phosphorous $SiO_2$.

9. A device in accordance with claim 8 including:

said second silicon dioxide dielectric layer over said control gate layer comprises a silicon dioxide TEOS (tetraethylorthosilicate) dielectric layer.

10. A device in accordance with claim 9 wherein:

said source regions and said drain regions comprise MDD (Medium Doped Drain) ion implanted doped regions.

11. A device in accordance with claim 8 wherein:

said source regions and said drain regions comprise MDD (Medium Doped Drain) ion implanted doped regions.

12. A device in accordance with claim 1 including:

said second silicon dioxide dielectric layer over said control gate layer comprises a silicon dioxide TEOS (tetraethylorthosilicate) dielectric layer.

13. A device in accordance with claim 12 wherein:

said source regions and said drain regions comprise MDD (Medium Doped Drain) ion implanted doped regions.

14. A device in accordance with claim 1 wherein:

said source regions and said drain regions comprise MDD (Medium Doped Drain) ion implanted doped regions.

15. A device in accordance with claim 14 wherein:

said conductive metal lines comprise tungsten metal.

16. The device of claim 1 wherein:

said source conductive metal lines comprise tungsten metal extending between source regions from one memory device to another memory device.

17. An integrated circuit including flash memory devices comprising:

a semiconductor substrate having said devices therein to which electrical connections are made, a tunnel oxide layer on said substrate, an array of gate electrode stacks formed on said tunnel oxide layer, said stacks having sidewalls with trench spaces therebetween down to said tunnel oxide layer, said sidewalls having oxidized sidewall films formed thereon, said gate electrode stacks including a doped floating gate electrode over said tunnel oxide layer, an intergate dielectric layer over said floating gate electrode, a doped control gate electrode over said intergate dielectric layer, at least a first dielectric layer over said control gate electrode, ion implanted source/drain regions formed between said stacks with alternating source regions and drain regions below said trench spaces between said sidewall, said source/drain regions being aligned with said stacks, spacer dielectric structures composed of a thin oxidized sidewall film and a silicon nitride layer contacting said sidewall films and said first dielectric layer, a second dielectric layer over said stacks including said first dielectric layer, said tunnel oxide layer in said trench spaces, and said spacer dielectric structures, said second dielectric layer having source line openings between said spacers extending through said second dielectric layer and said tunnel oxide down to said source regions, said second dielectric layer having drain plug openings between said spacers extending down through said second dielectric layer and said tunnel oxide to said drain regions, source conductive metal lines filling said source line openings between said stacks and said spacers over said source regions and contacting said source regions through said source line openings and, drain conductive metal lines filling said drain plug openings between said stacks and said spacers with metal drain plugs in contact with said drain regions through said drain plug openings, in said drain plug openings between said stacks, and an intermetal dielectric layer over said source lines, via openings over said drain plugs through said intermetal dielectric layer, bit line metal (44) formed over said intermetal dielectric layer (42) into said via openings extending down into contact with said drain plugs, whereby said memory devices include metallic source lines and drain plugs.

18. An integrated circuit including flash memory devices comprising:

a semiconductor substrate having said flash memory devices therein to which electrical connections are made, a tunnel oxide layer on said substrate, an array of flash memory gate electrode stacks formed on said tunnel oxide layer, said stacks having sidewalls with trench spaces therebetween down to said tunnel oxide layer, said gate electrode stacks including a doped floating gate electrode over said tunnel oxide layer, an intergate dielectric layer over said floating gate electrode, a doped control gate electrode over said intergate dielectric layer, thin oxidized sidewall films formed adjacent to said stacks, a silicon dioxide dielectric layer over said control gate electrode having edges, a silicon nitride ($Si_3N_4$) layer over said silicon dioxide layer having edges, spacer dielectric structures formed about said stacks composed of said thin oxidized sidewall films and a silicon nitride layer covering said oxidized sidewall films, covering said edges of said silicon dioxide dielectric layer and covering said edges of silicon nitride layer, ion implanted source/drain regions formed in said substrate between said stacks with alternating source regions and drain regions below said trench spaces between said sidewalls aligned with said stacks, a second, BPTEOS, dielectric layer over said stacks, said trench spaces and said sidewall, said second, BPTEOS, dielectric layer having source line openings therethrough and between said spacers down to surfaces of said source regions through said second dielectric layer and said tunnel oxide to the surfaces of said source regions, said second, BPTEOS, dielectric layer having drain plug openings therethrough and between said spacers down to surfaces of said drain regions through said second dielectric layer and said tunnel oxide to the surfaces of said drain regions, source conductive tungsten metal lines over said source regions between said stacks and said spacers filling said source line openings and contacting said source regions through said source line openings, drain conductive tungsten metal lines over said drain regions between said stacks and said spacers filling said drain plug openings with drain plugs in contact with said drain regions, an intermetal dielectric layer (42) over said source lines, via openings over said drain plugs through said intermetal dielectric layer, and bit line metal (44) formed over said intermetal dielectric layer into said via openings extending down into contact with said drain plugs, whereby said flash memory devices include metallic source lines and drain plugs.

* * * * *